(12) United States Patent
Lee

(10) Patent No.: US 6,358,789 B2
(45) Date of Patent: Mar. 19, 2002

(54) METHOD FOR MANUFACTURING A SEMICONDUCTOR DEVICE HAVING A CAPACITOR

(75) Inventor: Sang-Hyeob Lee, Ichon-shi (KR)

(73) Assignee: Hyundai Electronics Industries Co., Ltd., Ichon-shi (KR)

(*) Notice: Subject to any disclaimer, the term of this patent is extended or adjusted under 35 U.S.C. 154(b) by 0 days.

(21) Appl. No.: 09/736,416

(22) Filed: Dec. 15, 2000

(30) Foreign Application Priority Data

Dec. 24, 1999 (KR) ............................................. 99-62231

(51) Int. Cl.⁷ ......................................... H01L 21/8242
(52) U.S. Cl. ........................... 438/239; 438/3; 438/253; 438/396; 438/240
(58) Field of Search ........................... 438/239, 3, 253, 438/254, 255, 396, 397, 398, 240, 785, 778, 768, 770

(56) References Cited

U.S. PATENT DOCUMENTS 5,760,474 A * 6/1998 Schuele ...................... 257/754
6,218,293 B1 * 4/2001 Kraus et al. ................ 438/635
6,287,965 B1 * 9/2001 Kang et al. ................. 438/648

* cited by examiner

*Primary Examiner*—Tuan H. Nguyen
(74) *Attorney, Agent, or Firm*—Finnegan, Henderson, Farabow, Garrett & Dunner, L.L.P.

(57) ABSTRACT

A semiconductor device for use in a memory cell includes an active matrix, a capacitor structure, formed on top of the active matrix, an intermediate dielectric (IMD) layer formed on the capacitor structure and a barrier layer formed on the IMD layer, wherein the barrier layer includes a $TiO_2$ layer and an $Al_2O_3$ layer. Since the $Al_2O_3$ layer is obtained by oxidizing the $Ti_{1-x}Al_xN$ layer, the $Al_2O_3$ layer has a structure very dense. Therefore, the barrier layer prevents a capacitor structure from hydrogen damages caused by the formation of another IMD layer or a passivation layer during the following processes.

10 Claims, 5 Drawing Sheets

METHOD FOR MANUFACTURING A SEMICONDUCTOR DEVICE HAVING A CAPACITOR

FIELD OF THE INVENTION

The present invention relates to a method for manufacturing a semiconductor device; and, more particularly, to a method for manufacturing a semiconductor device having a capacitor structure.

DESCRIPTION OF THE PRIOR ART

As is well known, a dynamic random access memory (DRAM) with a memory cell comprised of a transistor and a capacitor has a higher degree of integration mainly by down-sizing through micronization. However, there is still a demand for downsizing the area of the memory cell.

To meet the demand, therefore, there have been proposed several methods, such as a trench type or a stack type capacitor, which is arranged three-dimensionally in a memory device to reduce the cell area available to the capacitor. However, the process of manufacturing three-dimensionally arranged capacitor is a long and tedious one and consequently involves high manufacturing cost. Therefore, there is a strong demand for a new memory device that can reduce the cell area with securing a requisite volume of information without requiring complex manufacturing steps.

In attempt to meet the demand, there have been introduced a semiconductor device incorporated therein a high K dielectric, e.g., $Ta_2O_5$, SBT (SrBiTaOx), PZT (PbZrTiOx) or the like, as a capacitor thin film in place of conventional silicon oxide film and/or silicon nitride film.

In case when a multi-level process (not shown) is applied to the above-described semiconductor device, an inter-metal dielectric (IMD) layer, e.g., made of $SiO_2$, must be formed on top of a metal interconnection by using a plasma CVD for the purpose of the insulation between each metal layer. Since the plasma CVD utilizes silane ($SiH_4$) as a source gas, the atmosphere for forming the IMD layer becomes a hydrogen rich atmosphere, and in this step, the silicon substrate is annealed at 400° C.

Therefore, the hydrogen gas generated by the plasma CVD process damages a capacitor thin film and a top electrode incorporated thereinto during the annealing process. That is, the hydrogen gas penetrates to the top electrode, further reaches to the capacitor thin film and reacts with oxygen atoms constituting the high K dielectrics of the capacitor thin film.

Furthermore, after the multi-level process, a passivation layer, e.g., made of $SiO_2$, is formed thereon by using a plasma CVD. This process also has a hydrogen rich atmosphere. Therefore, the hydrogen gas generated by the passivation process also damages the capacitor structure.

These problems, therefore, tend to make it difficult to obtain the desired reproducibility, reliability and yield.

SUMMARY OF THE INVENTION

It is, therefore, an object of the present invention to provide a method for manufacturing a semiconductor device incorporating a hydrogen barrier layer therein to prevent a capacitor thin film from a hydrogen damage which is caused by a plasma chemical vapor deposition (CVD) during the formation of a passivation layer.

In accordance with one aspect of the present invention, there is provided a method for manufacturing a semiconductor device for use in a memory cell, the method comprising the steps of:

a) preparing an active matrix provided with a transistor and an insulating layer formed around the transistor;

b) forming a capacitor structure on top of the insulating layer, wherein the capacitor structure includes a capacitor thin film made of a material having a high dielectric constant;

c) forming an intermediate dielectric (IMD) layer on top of the capacitor structure;

d) forming a $Ti_{1-x}Al_xN$ layer on the IMD layer; and e) carrying out a heat treatment in the presence of a gas containing oxygen, thereby converting the $Ti_{1-x}Al_xN$ layer into a $TiO_2$ layer and an $Al_2O_3$ layer formed on the $TiO_2$ layer for preventing the capacitor structure from hydrogen damages.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

There are provided in FIGS. 1A to 1H cross sectional views setting forth a method for manufacturing a semiconductor device in accordance with preferred embodiments of the present invention.

Figure 1A:
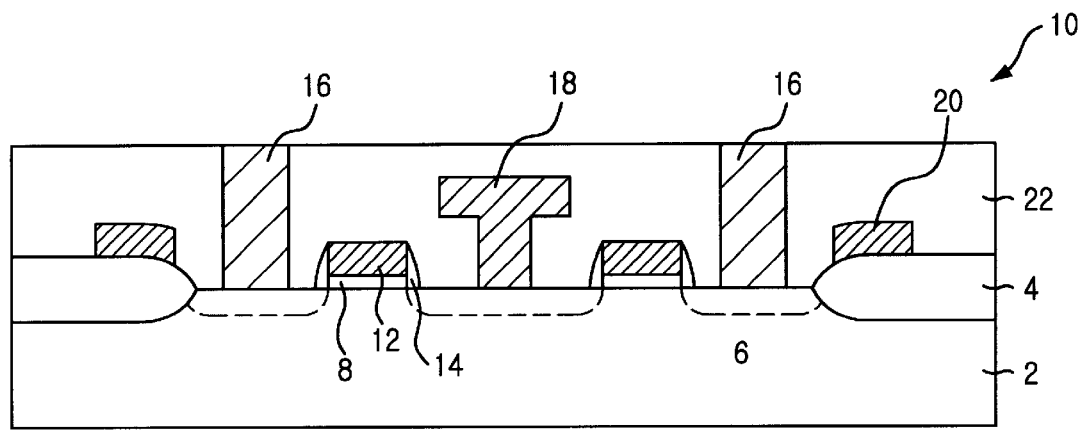
FIGS. 1A to 1H are schematic cross sectional views setting forth a method for the manufacture of the semiconductor memory device in accordance with the present invention.

The process for manufacturing the semiconductor device 100 begins with the preparation of an active matrix 10 including a semiconductor substrate 2, an isolation region 4, diffusion regions 6, gate oxides 8, gate lines 12, spacers 14, contact plugs 16 and an insulating layer 22, as shown in FIG. 1A. One of the diffusion regions 6 serves as a source and the other diffusion region 6 serves as a drain. The insulating layer 22 is made of a material, e.g., boron-phosphor-silicate glass (BPSG).

Figure 1B:
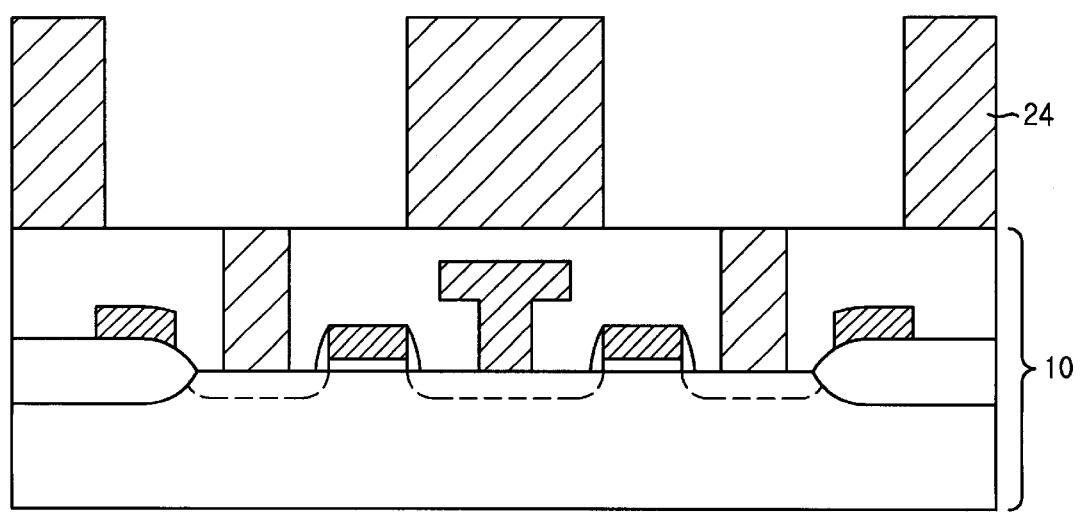

In a next step, a sacrificial layer is formed on top of the active matrix 10 by using a method such as CVD. And, the sacrificial layer is patterned into a predetermined configuration in such a way that the contact plugs 16 are exposed, thereby obtaining a patterned sacrificial layer 24, as shown in FIG. 1B.

Figure 1C:
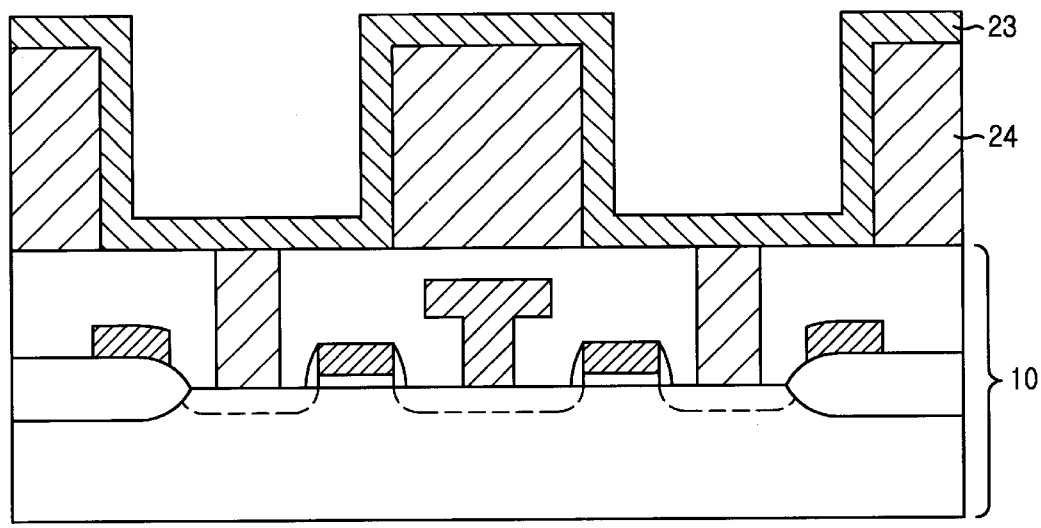

In an ensuing step, a first metal layer 23 is formed on top of the active matrix 10 and the patterned sacrificial layer 24 by using a semiconductor process, as shown in FIG. 1C. It is preferable that the first metal layer 23 is made of a material selected from a group consisting of a poly-Si, W, WN, $Wsi_x$, TiN, Pt, Ru, Ir and the like.

Figure 1D:
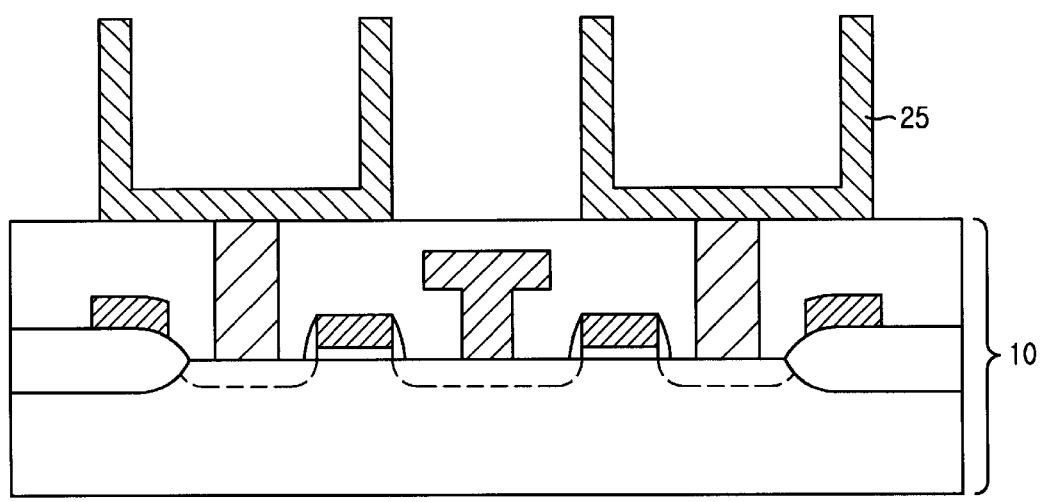

And then, the first metal layer 23 is planarized until the patterned sacrificial layer 24 is exposed. And, the patterned sacrificial layer 24 is removed by using a method such as a wet ething, thereby obtaining bottom electrodes 25, as shown in FIG. 1D.

Figure 1E:
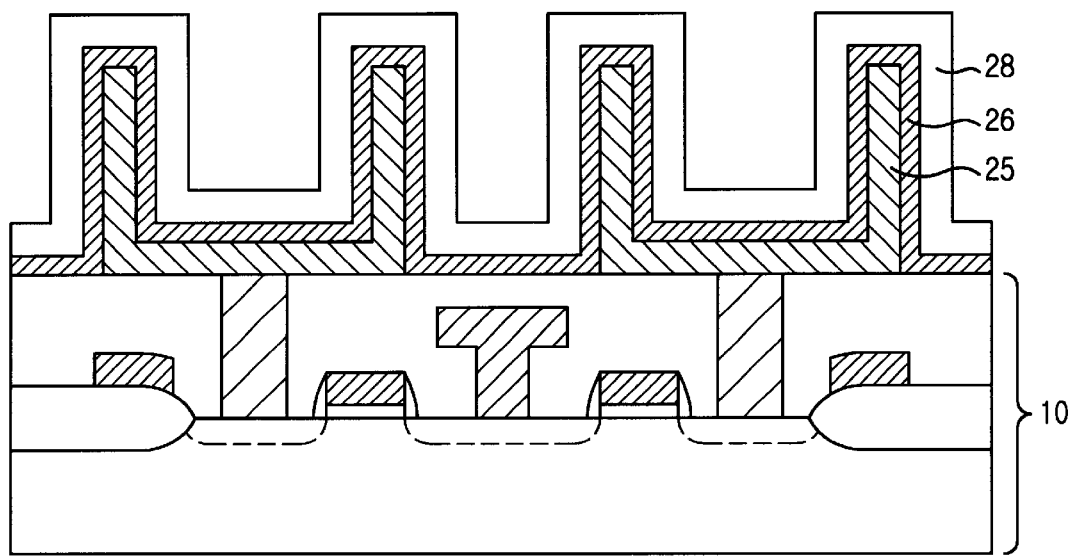

Thereafter, a capacitor dielectric layer 26 is formed on the bottom electrodes 25 by using a method such as CVD. Subsequently, a second metal layer 28 is formed on the capacitor dielectric layer 26, as shown in FIG. 1E. Preferably, the capacitor dielectric layer 26 is made of a material selected from a group consisting of $Ta_2O_5$, SBT (SrBiTaOx), PZT (PbZrTiOx) or the like.

Figure 1F:
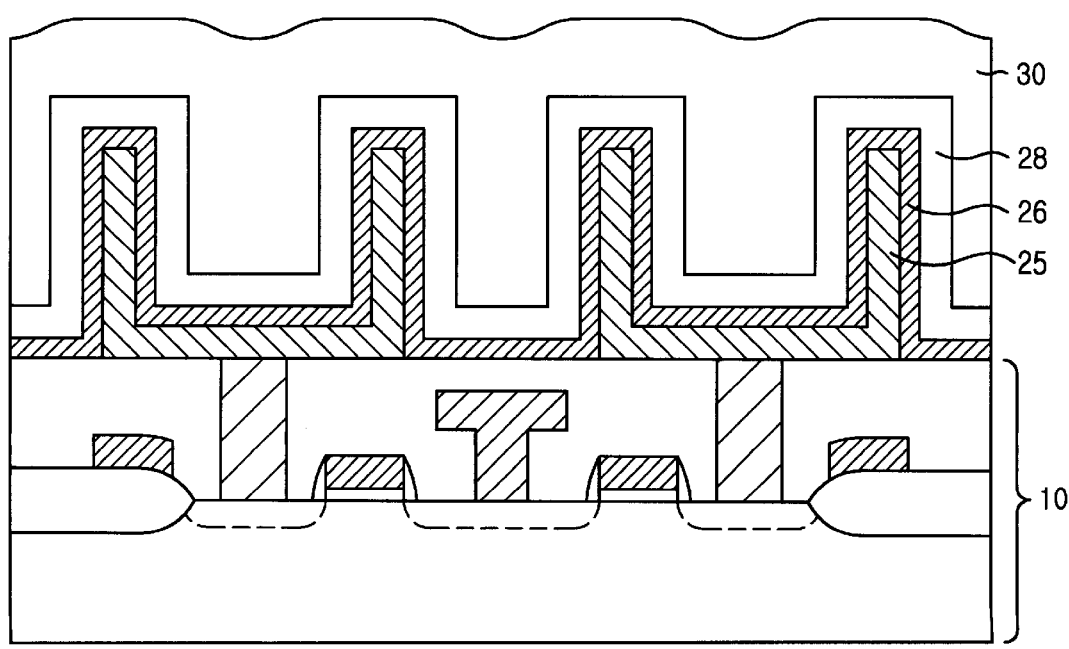

In a following step, an IMD layer 30 is formed on the second metal layer 28, as shown in FIG. 1F.

Figure 1G:
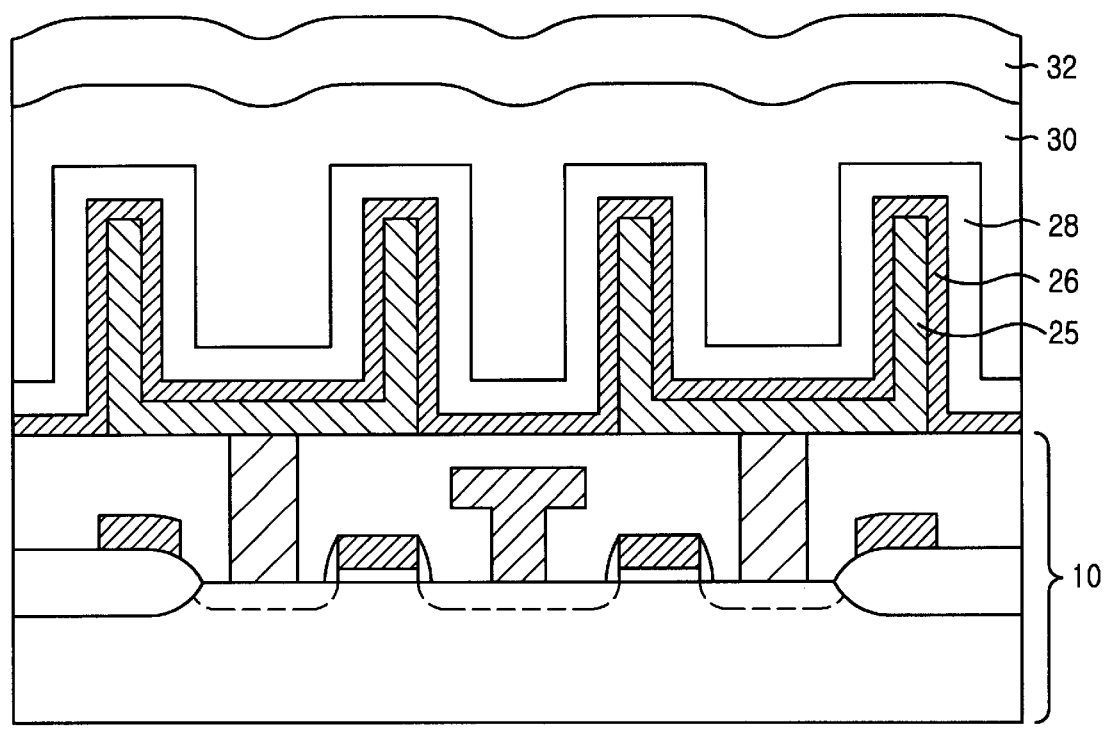

In a next step, a $Ti_{1-x}Al_xN$ layer 32 is formed on the IMD layer 30 in the presence of $N_2$ gases by using a method such as a reactive sputtering, x representing a molar fraction, as shown in FIG. 1G. In this step, the reactive sputtering utilizes a TiAl material as a target. Alternatively, the $Ti_{1-x}Al_xN$ layer 32 can be formed by using a chemical vapor deposition. This is achieved by utilizing a composition gas that is prepared by mixing $TiCl_4$, $AlCl_3$, $N_2$ and/or $NH_3$.

Figure 1H:
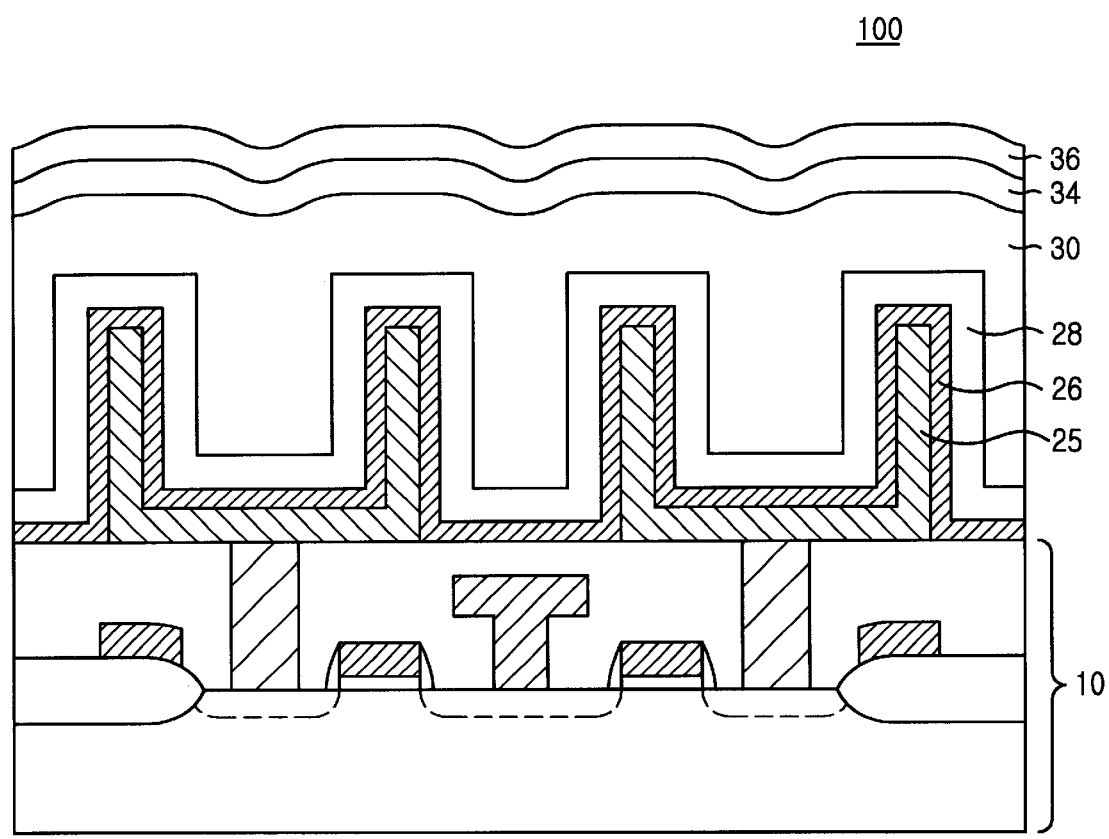

In an ensuing step, the $Ti_{1-x}Al_xN$ layer 32 is carried out a heat treatment in the presence of a gas selected from a group consisting of $O_2$, $N_2O$ and $O_3$, thereby converting the $Ti_{1-x}Al_xN$ layer 32 into a $TiO_2$ layer 34 and an $Al_2O_3$ layer 36, as shown in FIG. 1H. The $TiO_2$ layer 34 is formed on the IMD layer 30 and the $Al_2O_3$ layer 36 is formed on the $TiO_2$ layer 34. The thickness ratio between the $TiO_2$ layer 34 and the $Al_2O_3$ layer 36 is determined by the ratio between Ti and Al in the $Ti_{1-x}Al_xN$ layer 32. The $Al_2O_3$ layer 36 obtained from the present invention has a more densification structure than that obtained from a conventional method enough to prevent the capacitor structure from hydrogen damages. Further, the present invention can control a thickness of the $Al_2O_3$ layer 36 by changing the ratio of Ti and Al, a deposition temperature and a deposition atmosphere.

The present invention prevents a capacitor structure from hydrogen damages caused by the formations of an IMD and a passivation layers during the following processes. This is achieved by utilizing the diffusion barrier layer, which will not penetrate a hydrogen gas into the capacitor structures.

While the present invention has been described with respect to the particular embodiments, it will be apparent to those skilled in the art that various changes and modifications may be made without departing from the scope of the invention as defined in the following claims.

What is claimed is:

1. A method for manufacturing a semiconductor device, the method comprising the steps of:

a) preparing an active matrix provided with a transistor and an insulating layer formed around the transistor;

b) forming a capacitor structure on top of the insulating layer, wherein the capacitor structure includes a capacitor thin film made of a material having a high dielectric constant;

c) forming an intermediate dielectric (IMD) layer on top of the capacitor structure;

d) forming a $Ti_{1-x}Al_xN$ layer on the IMD layer; and e) carrying out a heat treatment in the presence of a gas containing oxygen, thereby converting the $Ti_{1-x}Al_xN$ layer into a $TiO_2$ layer and an $Al_2O_3$ layer formed on the $TiO_2$ layer for preventing the capacitor structure from hydrogen damages.

2. The method of claim 1, wherein the capacitor thin film includes a material selected from a group consisting of SBT, PZT or the like.

3. The method of claim 2, wherein the IMD layer includes an oxide material such as $SiO_2$.

4. The method of claim 1, wherein the gas includes a material selected from a group consisting of $O_2$, $N_2O$ and $O_3$.

5. The method of claim 4, wherein the step d) is achieved by utilizing a reactive sputtering.

6. The method of claim 5, wherein a TiAl material is utilized as a target.

7. The method of claim 6, wherein the step d) is achieved by utilizing a CVD method.

8. The method of claim 7, wherein the CVD method utilizes a composition gas that is prepared by mixing $TiCl_4$, $AlCl_3$, $N_2$ and/or $NH_3$.

9. The method of claim 4, wherein a thickness ratio between the $TiO_2$ layer and the $Al_2O_3$ layer depends on a molar fraction between Ti and Al in the $Ti_{1-x}Al_xN$ layer.

10. The method of claim 9, wherein the $Al_2O_3$ layer has a thickness ranging from approximately 30 Å to approximately 500 Å.

* * * * *